(12) United States Patent
Niiranen et al.

(10) Patent No.: US 11,742,979 B2
(45) Date of Patent: Aug. 29, 2023

(54) TRANSMISSION RATE ADAPTATION

(71) Applicant: Siemens Industry Software Inc., Plano, TX (US)

(72) Inventors: Miika Niiranen, Pirkkala (FI); Kari Vierimaa, Kempele (FI)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 17/783,398

(22) PCT Filed: Dec. 18, 2019

(86) PCT No.: PCT/US2019/067094
§ 371 (c)(1),
(2) Date: Jun. 8, 2022

(87) PCT Pub. No.: WO2021/126182
PCT Pub. Date: Jun. 24, 2021

(65) Prior Publication Data
US 2023/0017470 A1    Jan. 19, 2023

(51) Int. Cl.
*H04L 1/00*    (2006.01)
*G01R 31/28*    (2006.01)
*H04W 88/18*    (2009.01)

(52) U.S. Cl.
CPC ........ H04L 1/0002 (2013.01); G01R 31/2844 (2013.01); *H04W 88/181* (2013.01)

(58) Field of Classification Search
CPC . H04L 1/0002; G01R 31/2844; H04W 88/181
See application file for complete search history.

(56) References Cited

U.S. PATENT DOCUMENTS 6,647,210 B1 * 11/2003 Toyoda ................. H04J 3/0682
                                                                398/100
2006/0250972 A1 * 11/2006 Seebacher ............... H04L 43/50
                                                                370/242
(Continued)

FOREIGN PATENT DOCUMENTS

CN    114846837 A  *  8/2022    ......... G01R 31/2844
EP      2773068 A2  *  9/2014    ....... G01R 31/31718
(Continued)

OTHER PUBLICATIONS

Notification of transmittal of the International Preliminary Report on Patentability for International Application No. PCT/US2019/067094 dated Mar. 9, 2022.
(Continued)

*Primary Examiner* — Wutchung Chu
(74) *Attorney, Agent, or Firm* — Lempia Summerfield Katz LLC

(57) ABSTRACT

A method is provided for transmission rate adaptation of one or more data units, the method including: receiving, by an adapter, the adapter including an adaptation circuitry, a plurality of data units according to a first transmission rate and at least one delay character separating two consecutive data units; and transmitting, by the adapter, each of the plurality of data units received according to a second transmission rate, wherein the second transmission rate is determined based on the at least one delay character received.

19 Claims, 11 Drawing Sheets

(56) References Cited

U.S. PATENT DOCUMENTS

| | | | |
|---|---|---|---|
| 2007/0132475 A1* | 6/2007 | Carneiro Leao | G01R 31/31926 324/762.01 |
| 2010/0158515 A1* | 6/2010 | Watanabe | H04B 10/6932 398/186 |
| 2012/0317278 A1* | 12/2012 | Tamaki | H04L 1/0018 709/224 |
| 2014/0078916 A1* | 3/2014 | Kjeldaas | H04J 3/0632 370/252 |
| 2014/0280446 A1* | 9/2014 | Kasatani | G06F 16/957 709/201 |
| 2014/0282793 A1* | 9/2014 | Kasatani | H04L 65/762 725/116 |
| 2016/0127247 A1* | 5/2016 | Anzai | H04L 47/25 370/230 |
| 2017/0337988 A1* | 11/2017 | Yun | G01R 31/2851 |
| 2018/0156870 A1* | 6/2018 | Kim | G01R 31/31905 |
| 2020/0228434 A1* | 7/2020 | Olgaard | H04B 17/0085 |
| 2020/0343882 A1* | 10/2020 | van der Wagt | G01R 35/005 |
| 2022/0029667 A1* | 1/2022 | Dhananjay | H04B 17/3912 |

FOREIGN PATENT DOCUMENTS

| | | | | |
|---|---|---|---|---|
| EP | 2773068 A2 | 9/2014 | | |
| EP | 3531594 A1 * | 8/2019 | | H04J 3/07 |
| EP | 3531594 A1 | 8/2019 | | |
| WO | WO-2014191796 A1 * | 12/2014 | | H04L 27/2338 |
| WO | 2019035750 A1 | 2/2019 | | |
| WO | WO-2019035750 A1 * | 2/2019 | | G06F 9/45558 |

OTHER PUBLICATIONS

PCT International Search Report and Written Opinion of International Searching Authority dated Aug. 25, 2020 corresponding to PCT International Application No. PCT/US2019/067094.

* cited by examiner

FIG 7

Control symbols

| Input | | | | RD = −1 | RD = +1 |
|---|---|---|---|---|---|
| | DEC | HEX | HGF EDCBA | abcdei fghj | abcdei fghj |
| K.28.0 | 28 | 1C | 000 11100 | 001111 0100 | 110000 1011 |
| K.28.1 † | 60 | 3C | 001 11100 | 001111 1001 | 110000 0110 |
| K.28.2 | 92 | 5C | 010 11100 | 001111 0101 | 110000 1010 |
| K.28.3 | 124 | 7C | 011 11100 | 001111 0011 | 110000 1100 |
| K.28.4 | 156 | 9C | 100 11100 | 001111 0010 | 110000 1101 |
| K.28.5 † | 188 | BC | 101 11100 | 001111 1010 | 110000 0101 |
| K.28.6 | 220 | DC | 110 11100 | 001111 0110 | 110000 1001 |
| K.28.7 ‡ | 252 | FC | 111 11100 | 001111 1000 | 110000 0111 |
| K.23.7 | 247 | F7 | 111 10111 | 111010 1000 | 000101 0111 |
| K.27.7 | 251 | FB | 111 11011 | 110110 1000 | 001001 0111 |
| K.29.7 | 253 | FD | 111 11101 | 101110 1000 | 010001 0111 |
| K.30.7 | 254 | FE | 111 11110 | 011110 1000 | 100001 0111 |

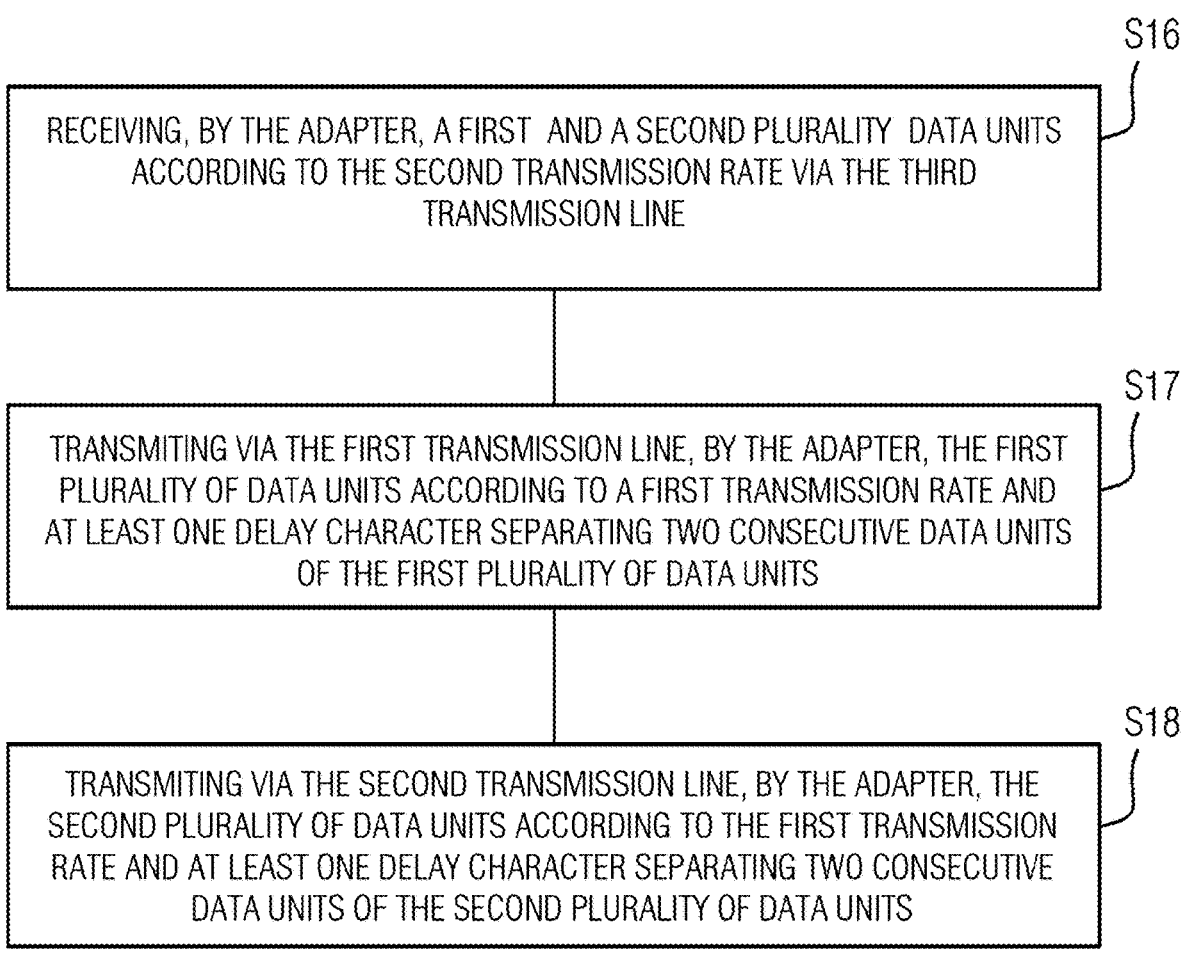

TRANSMISSION RATE ADAPTATION

The present patent document is a § 371 nationalization of PCT Application Serial No. PCT/US2019/067094, filed Dec. 18, 2019, designating the United States, which is hereby incorporated by reference.

TECHNICAL FIELD

The present disclosure relates to digital signal processing, in particular in the field of testing of Radio Base Station systems and system components. Digital signal processing (DSP) is the use of digital processing, such as by computers or more specialized digital signal processors, to perform a wide variety of signal processing operations.

BACKGROUND

Radio Base Station Systems rely on various types of digital integrated circuit (IC) designs, in the form of Field Programmable Gate Array (FPGA) or Application-Specific Integrated Circuit (ASIC) chips. The development and verification of these IC designs require realistic counterparts for the external digital radio frequency (RF) interfaces of the chip. Applicant proffers test devices for validating, verifying, and/or, e.g., testing of integrated circuits. In particular applicant's product family X-STEP, supports all phases of the chip development, from Register Transfer Level (RTL) simulation to hardware emulation, FPGA prototyping, full-speed ASIC/FPGA design verification, and hardware/software (HW/SW) integration. X-STEP supports all digital RF interface protocols and is ready to provide the needed real-life stimulus and full visibility into the interfaces in chip verification. With the X-STEP integration to hardware emulators and logic simulator, there is a unique opportunity to link pre- and post-silicon verification.

For pre-silicon testing, an integrated circuit's design may be described, before fabrication, in a hardware description language (HDL) language, and simulated on a simulator. Several test cases are run to check whether the design behaves functionally correct or not. These tests are run on the simulator at MHz speed (simulator clock frequency). This may take a lot of time to cover all the test cases through pre-silicon verification.

After an integrated circuit is sufficiently verified at the pre-silicon stage post-silicon test may be executed on the integrated circuit's actual hardware. The advantage of post-silicon validation is that verification may be performed significantly faster compared to the pre-silicon testing stage.

Because of the limited observability of the integrated circuit's functioning during post-silicon testing, runtime verification has been introduced in order to be able to detect errors that slipped pre- or post-silicon testing.

X-STEP O-RAN testing solution is used in fronthaul verification between O-DU (O-RAN Distributed Unit) and (O-RU, O-RAN Radio Unit). X-STEP may act as O-DU or O-RU or monitor and capture Ethernet traffic between those units. O-RAN is a feature over 10 GbE/25 GbE functionality encapsulated into evolved Common Public Radio Interface (eCPRI). O-RAN support is part of the XSTEP test device Ethernet 10G/25G. Common to Ethernet, eCPRI, and O-Ran, X-STEP provides a streaming concept where the user defines protocol payload and the protocol core generates a stream of packets. In capture direction the streaming concept allows easy extraction of samples example from a single antenna or multiple antennas. X-STEP O-RAN implementation has support for both LTE and 5G NR. X-STEP solutions cover various digital interface protocols, and more protocols are constantly being implemented and explored. X-STEP may thus be used as a software-based protocol test device in the development and testing of packet-based 5G and frame-based 4G Fronthaul interfaces. Protocols used in these Fronthaul interfaces include eCPRI and CPRI.

From U.S. Pat. No. 6,665,230 B1, a programmable delay compensation circuit has become known Therein, a circuitry for programming the amount of delay applied to an input signal based on determining the number of delay elements required to capture a clock cycle is proposed.

European patent application publication no. EP 3531594 A1 discloses a transmission rate adjustment method and a network device, to support rapid adjustment on transmission rates of a service in transmission channels on upstream and downstream interfaces of a network node.

International patent publication WO 2019/035750 A1 discloses a method and transition device for enabling communication of data between a remote radio unit and a central baseband unit in a wireless network. The transition device then establishes a data flow between the remote radio unit and the central baseband unit over the transition device and performs conversion between the first interface configuration and the second interface configuration for data communicated in the data flow, using the selected interface functions.

European patent application publication EP 2773068 A2 discloses a test device for testing a device under test (DUT) having a control interface compliant with a standard selected from a plurality of standards each supporting a common set of management data input/output (MDIO) and non-MDIO control signals, wherein the test device includes a test interface and an integrated control interface.

SUMMARY

The scope of the present disclosure is defined solely by the appended claims and is not affected to any degree by the statements within this summary. The present embodiments may obviate one or more of the drawbacks or limitations in the related art.

The software-based architecture of the test device implies that a test device uses software pre- and post-processing as a part of protocol data generation and analysis. The hardware components of the test device then take care of transmitting and receiving protocol data between onboard RAM and a (e g, customer's) device under test (DUT) at the target line bit rate of the DUT, (e.g., a fronthaul device), nowadays ranging from 6 Gbps to 25 Gbps.

Line bit rates in the above-mentioned range may be used in fiber-optic interfaces. However, in FPGA-based pre-silicon prototypes of 4G and 5G chipset designs, the line bit rates are scaled down by two decades, at least, to match the non-realtime clock rates of those slow-running prototypes. That is, a prototyping platform and in particular the DUT may operate at line bit rates of 1 to 100 Mbps. Making, for example, X-STEP's, hardware work at those significantly lower bit rates is problematic because the high-speed transceivers that are used for the fiber-optic interfaces of a test device do not scale below 600 Mbps or even below 10 Gbps, depending on the interface type.

On the other hand, a device under test, (e.g., the prototyping platform), may support higher transmission rates than the one's of the test device. In that case, it is the device under test that needs to be slowed down in order to match the transmission rate of the test device. Such a case may arise in post-silicon testing in which the device under test is a silicon prototype of the integrated circuit to be tested, and the integrated device under test is running according to its raw speed.

The problems outlined in the above are solved by multiple aspects.

According to a first aspect a method for transmission rate adaptation performed by a test system including an adapter located between a test device and a device under test is proposed.

According to a second aspect, an adapter of a test system for adapting a transmission rate of one or more data units, the adapter including an adaptation circuitry, operative to carry out the method according to the first aspect is proposed, the adapter being located between a test device and a device under test.

BRIEF DESCRIPTION OF THE DRAWINGS

FIG. 7 depicts exemplary examples of delay characters.

FIG. 14 depicts exemplary method acts according to a fifth embodiment.

DETAILED DESCRIPTION

Figure 1:
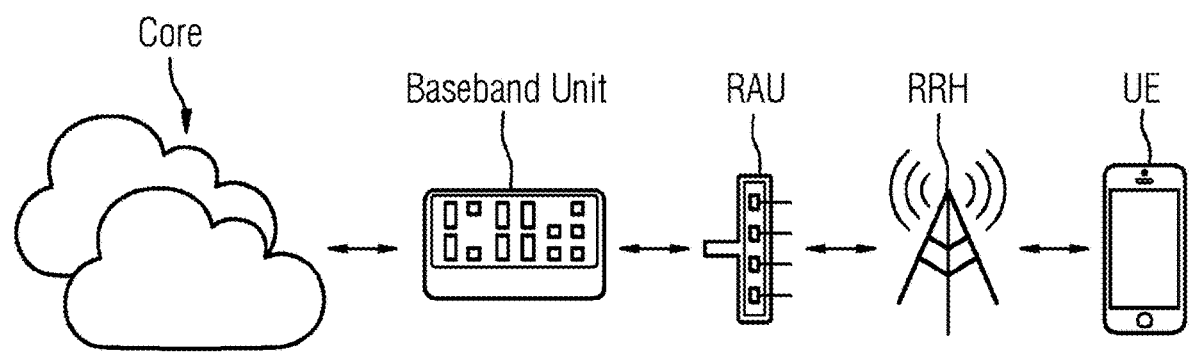
FIG. 1 depicts an example of a radio communication system.

In FIG. 1, a radio communication system is illustrated. The traditional monolithic base transceiver station (BTS) architecture is increasingly being replaced by a distributed BTS architecture in which the functions of the BTS are separated into two physically separate units—a baseband unit (BBU) and a remote radio head (RRH). The BBU performs baseband processing for the particular air interface that is being used to wirelessly communicate over one or more radio frequency channels. The RRH performs radio frequency processing to convert baseband data output from the BBU to radio frequency signals for radiating from one or more antennas coupled to the RRH and/or to produce baseband data for the BBU from radio frequency signals that are received at the RRH via one or more antennas. The RRH may be installed near the one or more antennas, e.g., at the top of a tower, and the BBU may be installed in a more accessible location, e.g., at the bottom of the tower. However, as the case may be RRH and BBU may be collocated, e.g., in a lab. The BBU and the RRH may be connected through one or more fiber optic links. The interface between the BBU and the RRH is defined by fronthaul communication link standards such as the Common Public Radio Interface (CPRI) family of specifications, the Open Base Station Architecture Initiative (OBSAI) family of specifications, and the Open Radio Interface (ORI) family of specifications.

In the 5G architecture, a new frequency domain fronthaul interface will be specified. The frequency domain fronthaul is a functional split where the IFFT/FFT (Inverse Fast Fourier Transform/Fast Fourier Transform) may be moved from the BBU to the RRH. Frequency domain samples instead of time domain samples are sent over the fronthaul. The RRH will have information through a communication channel about the resource al-location for different UEs. The new eCPRI interface specification "eCPRI Specification V1.0 (2017 Aug. 22)" is already available.

For the deployment scenario where the remote radio head (RRH) (sometimes also denoted as Radio Remote Unit or RRU) and the baseband unit (BBU) (sometimes also denoted as radio equipment controller or REC) are separated, the signals received from one or more antennas have to be transported over the media that is connecting the RRH with the BBU as normally the signal combination is done at the BBU. The interface that is used for the connection between the BBU and the RRH may be called the fronthaul. The signals over the fronthaul may be complex time domain samples such as specified in the legacy Common Public Radio Interface (CPRI). Digitized waveforms may be transported over the fronthaul from the BBU to the RRH, and vice versa, via one or more radio aggregation units (RAU).

The user equipment's (UE) signals are power limited and as the path loss varies with the distance to the UE a large dynamic range is encountered when those signals are represented digitally, it may be assumed that for the complex frequency sample a large number of bits will be required and in the case of MIMO (Multiple Input Multiple Output)/diversity layers the required fronthaul capacity will multiply with the number of antennas. Furthermore, it is desired to model such propagation of radio signals in order to test the functionality of the radio system and its components. As the capacity on the fronthaul is limited, it is desired to find methods that optimize the usage of the fronthaul. As illustrated, the BBU may be connected to a core network (Core) and possibly to other BBUs (not shown) via one or more backhaul or cross-haul connections.

Figure 2:
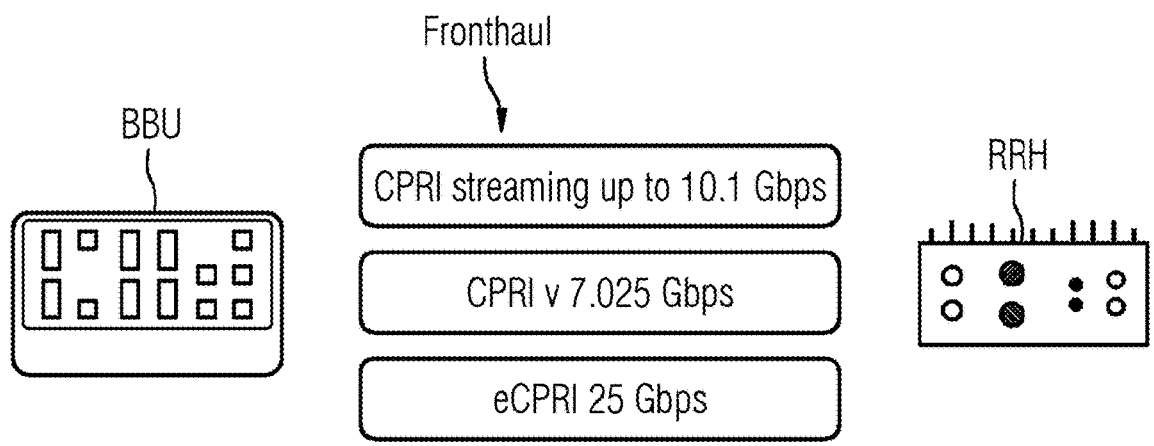
FIG. 2 depicts an example of a fronthaul data transmission between a baseband unit and a remote radio head.

In FIG. 2, fronthaul data transmission using different protocols is illustrated. As mentioned, the different protocols employed have different bandwidth capacities. Hence, the CPRI streaming supports up to 10.1 Gbps, whereas CPRI v7.0 supports 25 Gbps, and eCPRI supports up to 25 Gbps, e.g., between the RRH and the BBU.

I/Q data, (in-phase and quadrature components data), is digitalized air-interface data. The sample rate in 5G is 122.88 MHz. Thus, especially in case of multiple radio channels, a high amount of data needs to be transmitted via the fronthaul. I/Q data transmission may occur in uplink and downlink direction for each radio channel.

Figure 3:
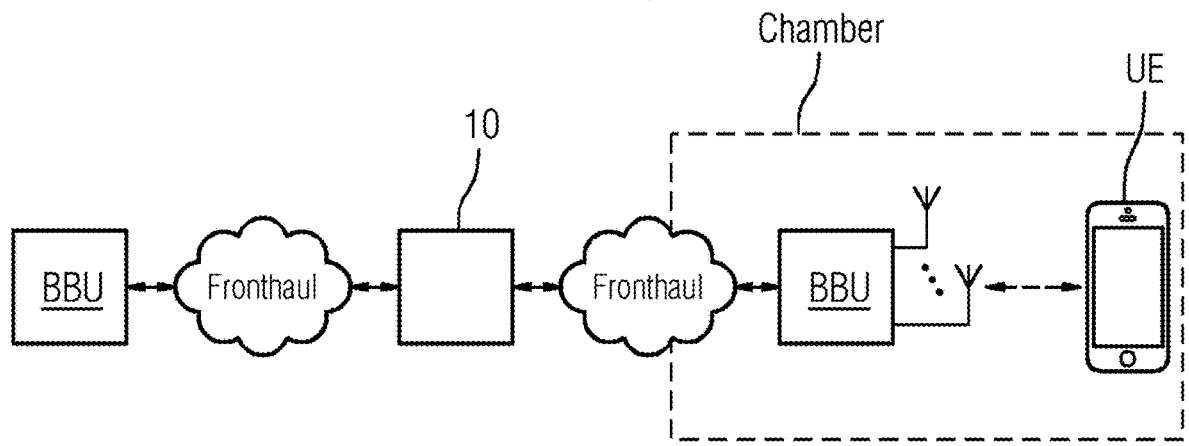
FIG. 3 depicts an example of a system for testing radio equipment.

In FIG. 3, a testing environment for testing radio equipment is illustrated. SIEMENS is developing innovative test systems for ASIC and FPGA verification and validation in the areas of simulation, hardware emulation, Field Programmable Gate Array (FPGA) prototyping, and real time (e.g., post-silicon, manufacturing) environments. Such test systems may include one or more test devices that may be utilized in a variety of high-tech fields, ranging from cellular base stations to the automotive industry. For example, a radio equipment test system or test device 10, (e.g., from the X-STEP product line), allows stimulation and tracing of all the digital interfaces in a modern radio equipment such as a radio equipment control (REC) and/or radio equipment (RE) modules (also known as baseband unit, BBU, and remote radio head, RRH, respectively). The digital interface protocols supported by such a test device 10 may include JESD204B, CPRI, OBSAI RP3, and/or 10G Ethernet. A test device 10 may further include in register-transfer level (RTL) simulation and hardware emulation and may also be suitable for FPGA prototyping, real-time post-silicon board debugging, and/or final product testing. The test device 10 may cover every phase in a radio base station's product development cycle, ranging all the way from very first RTL simulations to post-production. The same tests may then be re-used in every phase of the product development cycle of a device under test (DUT). Also, due to the parameterized test case building block architecture, the porting of test cases from one project to another is facilitated.

As illustrated in FIG. 3, the test device 10 is arranged between the BBU and the RRH and communicatively coupled to the BBU and the RRH, via a respective fronthaul connection. However, other test setups including the test device 10 have become known. For example, in international application PCT/US2019/055623 and European application EP 18200162, respectively, different test systems and arrangements are disclosed. Therein, the test device may be coupled to a BBU only. To that end, simulation or emulation of one or more UEs may be performed by the test device. Alternatively, the test device 10 may be coupled to an RRH. To that end, the BBU may be emulated or simulated by the test device 10.

A channel model is a (test-)model for the behavior of one or more radio signals transmitted over the air interface. This channel model enables to test radio equipment in lab environments or even on-site. Testing may be operationally performed as illustrated in FIG. 3. For example, a channel model test device 10 may be used that performs the processing of the radio frequency signals, (e.g., in the form of I/Q data), according to one or more channel models. All connections, (e.g., between the base station and/or the test apparatus and/or the UE), may be made by coaxial cables.

Figure 3A:
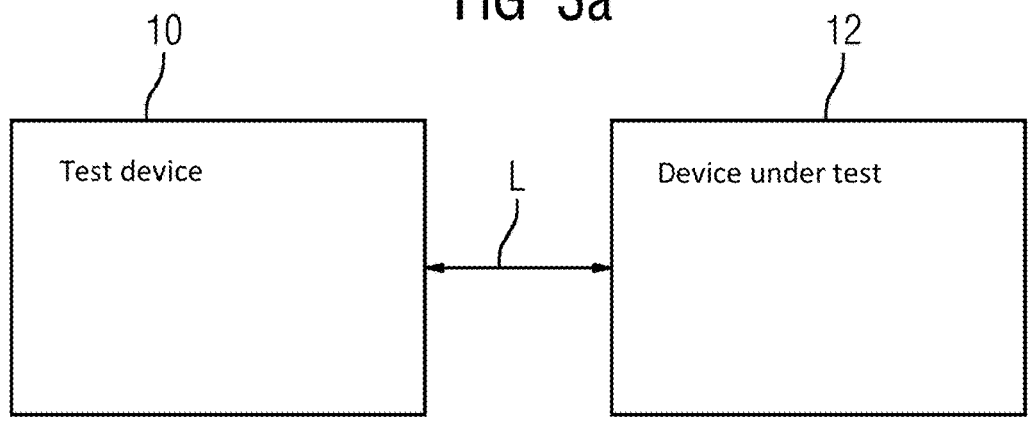
FIG. 3a depicts an example of a test device coupled to a device under test.

Turning to FIG. 3a, the one or more devices 12 connected to the test device 10 may be considered the devices under test (DUT) 12 as the digital signal processing and the functioning of those devices 12 may be tested, e.g., whether they are working according to the specified requirements of a customer (validation) or a standard (verification).

As mentioned earlier, systems, such as radio base stations, rely on various types of digital IC designs, e.g., in the form of FPGA or ASIC chips. The development and verification of these IC designs require realistic counterparts for the external digital interfaces of the chip. In particular in the case of pre-silicon testing the simulated or emulated DUT 12 may process data only at a lower speed than the test device 10. Hence, a reduction of the transmission rate of the test device 10 is required.

To work around the transceiver limitation of the DUT 12, an external optical-to-electrical conversion and buffering unit may be designed to connect the test device 10 to a slow-running prototype (DUT 12), e.g., for verifying fronthaul interfaces early, in the pre-silicon phase. However, no matter how large buffers of such an adapter are, they would eventually overflow if the transmitting side, (e.g., the test device 10), is not slowed down according to the slow-down factor of the DUT 12. Hence, a flow control may be required on the test device 10 side, in addition to implementing the external converter/buffering adapter itself.

Due to the software-based architecture, a hardware-based flow control is difficult to implement on a test device 10, as it would require major re-design of the transmission and reception data path. In practice, such a flow control would require a new protocol to be implemented on top of the fiber-optic interfaces to limit the data flow to/from the slow-running DUT 12, e.g., of a customer. That is, the fronthaul transport protocol (e.g., eCPRI™, CPRI™) would need to be encapsulated into another protocol that would be capable of transmitting data only when requested, effectively limiting the transmission rate to the level that the DUT 12 is able to handle. However, the design of a test device 10 may not be suited to support such a slowed-down transmission, because it serves (primarily) as a fronthaul protocol streaming and/or capturing device. Although Ethernet pause frames may be used to implement flow control in Ethernet-based slow-down solutions, this requires proper Ethernet MACs to be implemented in all interfaces of the arrangement, (e.g., the test device 10 and the DUT 12), and may thus not be supported by a test device 10.

Another possibility is to implement different hardware components, e.g., different test devices 10 that are configured to the specific transmission rate of the respective DUT 12. In such a case, at least two variants of test devices 10 would be necessary; one for full-speed testing (DRT=Device for Real-Time) and another one for slower designs (DNRT=Device for Non-RealTime). The latter may provide direct connections between the individual FPGA GPIO, general purpose input/output, pins of the DUT 12, and the test device 10 and configure them as slow as necessary, even below 1 Mbps, in spite highspeed transceivers of the test device 10 and the DUT 12 being present. For the synchronization between a DUT 12 and the test device, a data bit/word clock may be provided from the DUT 12 towards the test device 10 so that flow control is not necessary. Having different hardware variants of a test device 10 is not optimal from a manufacturing resourcing perspective as both of the variants have to be maintained and supported. A single hardware being able to adapt its transmission rate may be provided. Moreover, a single hardware for all project phases is advantageous, because the re-use possibilities of pre-silicon tests in post-silicon and/or even runtime verification are facilitated. Thus, it would be possible to keep using a single hardware that is capable of handling the multiple project phases, pre- and post-silicon as well as runtime testing.

Hence, the problem exists that a sending station (e.g., computer or network switch) may be transmitting data faster than the other end of the link L may accept it.

Due to above-mentioned problems, it is desired to have a single hardware that is capable of inter-operating with all kinds of targets, e.g., real time and non-real time devices. In particular, a solution is desired that makes the hardware run slower than what its transceivers are capable of.

Figure 4:
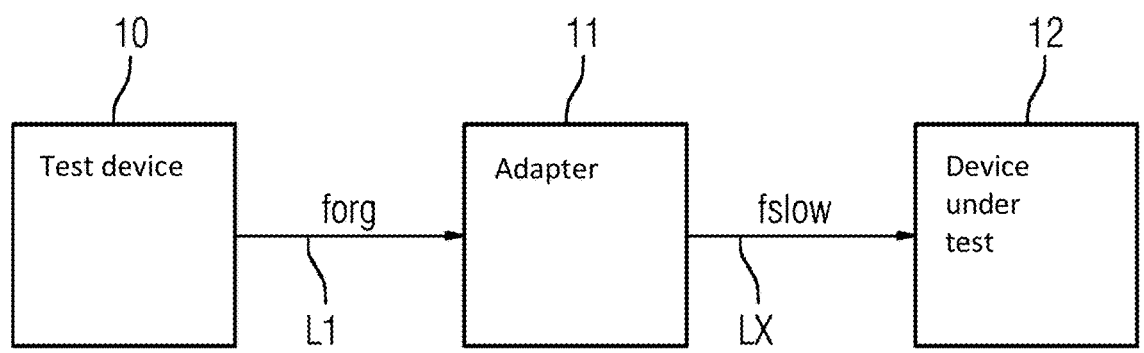
FIG. 4 depicts an example of an adapter communicatively coupled to a test device and a device under test.

Now turning to FIG. 4, it is proposed to replace hardware-based flow control by software that scales the original high-speed transmission rate, e.g., the packet rate or frame rate, down to the speed of the DUT 12. The software may be part of the test device 10, e.g., a software module including a corresponding function. It is proposed to insert, e.g., by the software on the test device 10, one or more delay characters in the software-based stimulus generation, e.g., characters representing test data, for achieving a transmission rate scale-down.

Figure 5:
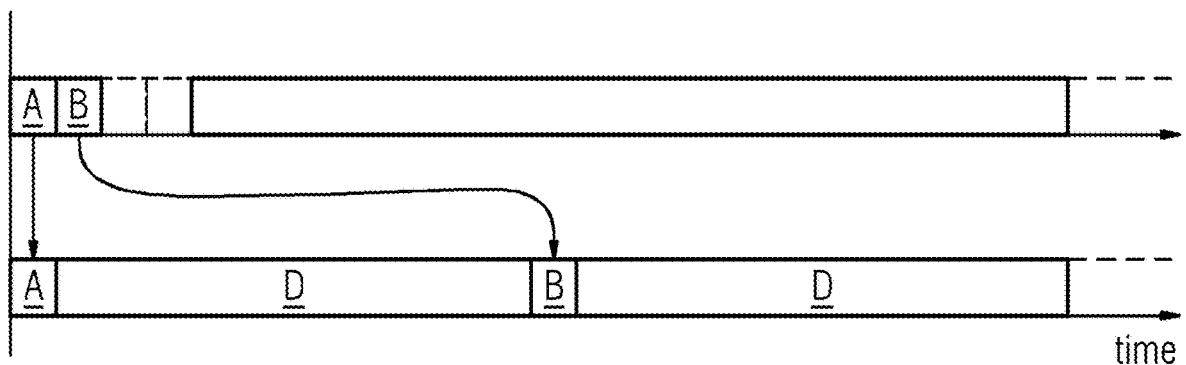
FIG. 5 depicts an example of a transmission of data packets according to a first transmission rate, wherein delay characters are inserted in between data packets.
Figure 6:
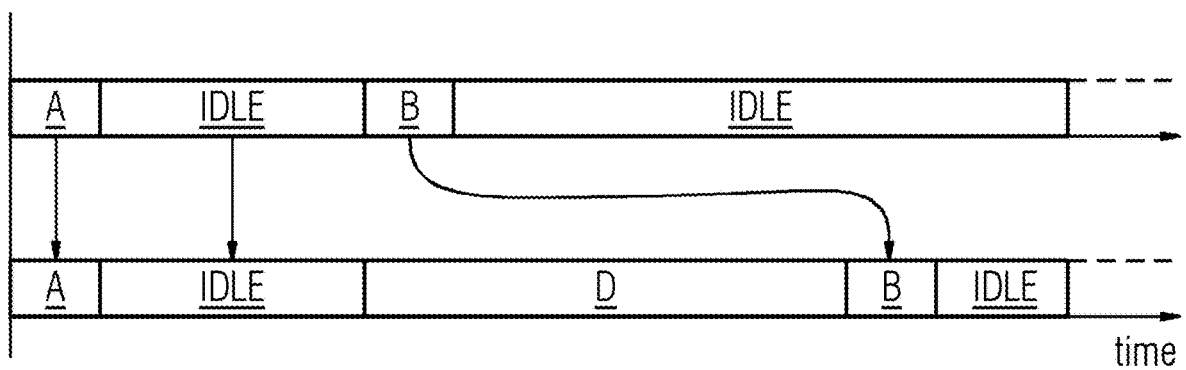
FIG. 6 depicts an example of a transmission of data frames according to a first transmission rate, wherein delay characters are inserted in between data frames.

The delay character, identified by reference sign D in FIGS. 5 and 6, may be a reserved character, e.g., a control character, or a (payload) data character, such as an unused comma, for example, of the XGMII, 10 Gigabit Media Independent Interface, 8b10b character set. The control and data characters for XGMII are defined in the IEEE Std. 802.3-2012. The delay character may be a (payload) data character, e.g., a data character of the XGMII character set. A (delay) character may thus be a hexadecimal character having an 8-bit representation, e.g., in the XGMII character set. Thus, a delay character indicating a delay for transmitting one or more data units received is introduced. The delay character may be a dedicated character in a given character set.

Hence there is first link L1 between the test device 10 and an adapter 11 operating at a first transmission rate forg. Additionally, there is a second link LX between the adapter 11 and the DUT 12 operating at a second transmission rate fslow. The test device 10 transmits data units, e.g., including testing stimulus for testing the DUT, and delay characters to the adapter. The adapter 11 determines the delay characters among or between the data units and discards the delay characters. Consequently, the adapter 11 transmits only the data units (and not the delay characters) to the DUT 12. As will be described later, the reverse direction of data unit transmission, e.g., from the DUT 12 to the test device 10, operates correspondingly, e.g., the adapter 11 inserts delay characters in between data units received from the DUT 12. To that end, the adapter may include a corresponding software module that introduces the delay characters in between the data units received from the DUT 12.

Now returning to the direction of transmission from the test device 10 to the DUT12, the one or more delay characters may be inserted between the data units by the test device 10. The data units of the test device 10 may represent stimulus input for testing the DUT 12. Hence the test device 10 generates the one or more delay characters and the data units. Therein, the delay characters indicate a transmission rate adaptation for the data units, e.g., a transmission delay when transmitting the data units to the DUT 12.

Thus, an adapter 11 may be introduced that filters the one or more delay characters. The adapter may be part of the test device 10, (e.g., within the housing of the test device 10), or may be attached to the device 10, (e.g., the adapter has its own housing, separate from the housing of the test device 10.

Turning to FIG. 5, when the line bit rate of the DUT 12 is known, it is possible to calculate, (e.g., by the test device 10), the required slow-down factor and implement the slow-down factor by way of one or more delay characters to extend inter-packet gaps in a packet-based protocol used for data transmission, e.g., Ethernet, or eCPRI. That is to say, based on the determined slow-down factor an inter-packet gap may be calculated and implemented, by the test device 10, using one or more delay characters that are inserted between two data packets A, B. Instead of data packets A, B, any other suitable data unit may be employed by the protocol used. Thus, it is also possible to introduce gaps between frames in frame-based protocols, such as CPRI, even though frame-based protocols don't normally allow any gaps between frames. That is, by inserting delay characters in between packets/frames, a scale down of the packet/frame rate, e.g., link throughput is achieved.

In FIG. 5 data frame transmission at the data link layer is shown. In case of data frames, as shown in FIG. 5, the frame data (e.g., continuous stream) needs to be split into reasonable small segments (A, B, . . . ). For example, in case of CPRI, one frame is 10 ms long. This may be a too huge amount to store in the memory of the adapter, e.g., an FPGA. Hence, the data needs to be split into smaller segments. The segment size may be related to the buffer size of an FPGA in the adapter 11.

For example, the link L1 may operate according to a transmission rate forg of 98.304 Mbit/s and the link LX may operate according to a transmission rate of 49.152 Mbit/s. Hence, the first transmission rate is not only different, but in this example 200 times faster than the second transmission rate fslow. In that case 199 delay characters are inserted in between two data units. That is to say, one data unit followed by 199 delay characters are transmitted until the next data unit is transmitted and so on.

In FIG. 6 data packet transmission at the physical layer is shown. In this case the link L1 may operate according to a transmission rate forg of 2.578.125 Mbit/s and the link LX may operate according to a transmission rate of 515.625 Mbit/s. Hence, the first transmission rate is not only different, but in this example 500 times faster than the second transmission rate fslow. The data to be transmitted needs to be split into smaller segments, cf. as well the description relating to FIG. 5. The splitting may be irrespective of the packet end or the packet start. However, it may be possible to take into account beginning and or ending of a data packet when splitting data into suitable segments. For example, in the case of 64b66b coding and a transmission rate difference of the factor 500 one data unit (segment) is followed by 499 delay characters until the next data unit is transmitted.

An IDLE character may be generated by the transceiver of the device(s) 10, 11, 12. IDLE character is part of Ethernet protocol is transmitted between Ethernet packets. However, a delay character is a character newly introduced and generated by the test device 10 or the adapter 11, respectively. The delay character serves for changing the transmission rate.

Now turning to FIG. 7, exemplary examples of a delay character in case of an 8b10b coding are provided. As mentioned earlier, one delay char may be one byte/octet. The delay character may be one of unused control symbols that are not already used by CPRI. A delay character in 64b66b coding case may be one unused type of control character in Control Block (C0, C1, C2, . . . , C7), for example 0x07 or 0x00. The representations of the control characters are the control codes. XGMII encodes a control character into an octet (an eight-bit value). However, another bit value may be used.

One or more delay characters, e.g., XGMII characters, may be mapped into 66-bit blocks, and vice versa, using a 64B/66B coding scheme. 64B/66B encodes 8 data octets or control characters into a block. Exemplary mappings are shown in IEEE 802.3 48. Physical Coding Sublayer (PCS) and Physical Medium Attachment (PMA) sublayer, type 10 GBASE-X.

Figure 8:
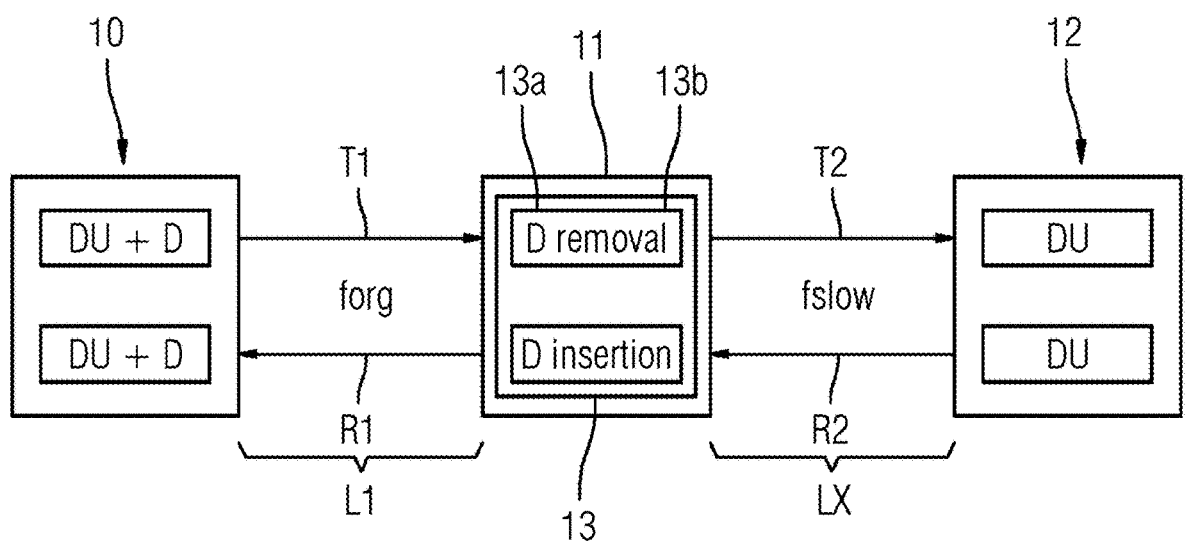
FIG. 8 depicts another example of an adapter communicatively coupled to a test device and a device under test.

Now turning to FIG. 8, in addition to a test device 10, (which may be a device from applicants X-STEP series), the adapter 11, (also referred to as conversion and/or buffering unit), also may be capable of inserting delay characters in its transmission towards the test device 10, (e.g., X-STEP), to scale up the line bit rate of the link. This may be performed automatically for example when there are no packets/frames ready to be sent in the buffer. The reverse of this delay insertion, (e.g., delay removal), may be performed in by the test device 10, (e.g., X-STEP), when receiving the packets/frames, via software-based post-processing, in order to restore the original packet/frame content and phase. The adapter 11, on the other hand, simply ignores the delay characters while forwarding all other characters (e.g., IDLE and packets, or frames) towards the device under test (DUT) 12.

Providing a delay insertion/removal logic into an adapter 11, or a conversion and/or buffering unit, which may be part of the adapter 11, makes it possible to insert and/or remove one or more DELAY characters. By inserting/removing the one or more delay characters it is possible to keep the original inter-packet gaps, and at the same time maintain the original line bit rate of 6 to 25 Gbps in the test device, e.g., X-STEP. The test device's transmitter/receiver is then able to maintain the high-speed data rate as mostly DELAY characters are transmitted/received that are remove/inserted in the conversion unit. This helps provide that the, e.g., optical-to-electrical, conversion/buffering unit never encounters data overflow issues as the flow is limited in the transmitter side, e.g., the test device side. As another benefit the proposed solution is suitable to be deployed in a software-based architecture of the test device, such as the one of X-STEP, and does not require FPGA logic/firmware changes in the test device. The only requirement from the test device is to have the software support in place for link throughput scale-down by inserting/removing one or more delay characters.

In the transmit direction, the 10GBASE-X PCS accepts packets from the PCS client on the XGMII. Due to the continuously signaled nature of the underlying PMA, and the encoding performed by the PCS, the 10GBASE-X PCS maps XGMII data and control characters into a code-group stream. In the receive direction, the PCS decodes the code-group stream received from the PMA, maps the code-groups to XGMII data and control characters and forwards the character stream to the XGMII to the PCS client for further processing. More details on the XGMII character encoding may be found in the "Proposal for an Initial draft of 10 GBaseCX4" under http://www.ieee802.org/3/10GBCX4/public/jan03/WPcls48_1_0.pdf.

For the purpose of pre-silicon testing, a digital ASIC, ASSP, FPGA, or SoC design or part thereof may be mapped into one or more FPGAs of the DUT 12.

Figure 9:
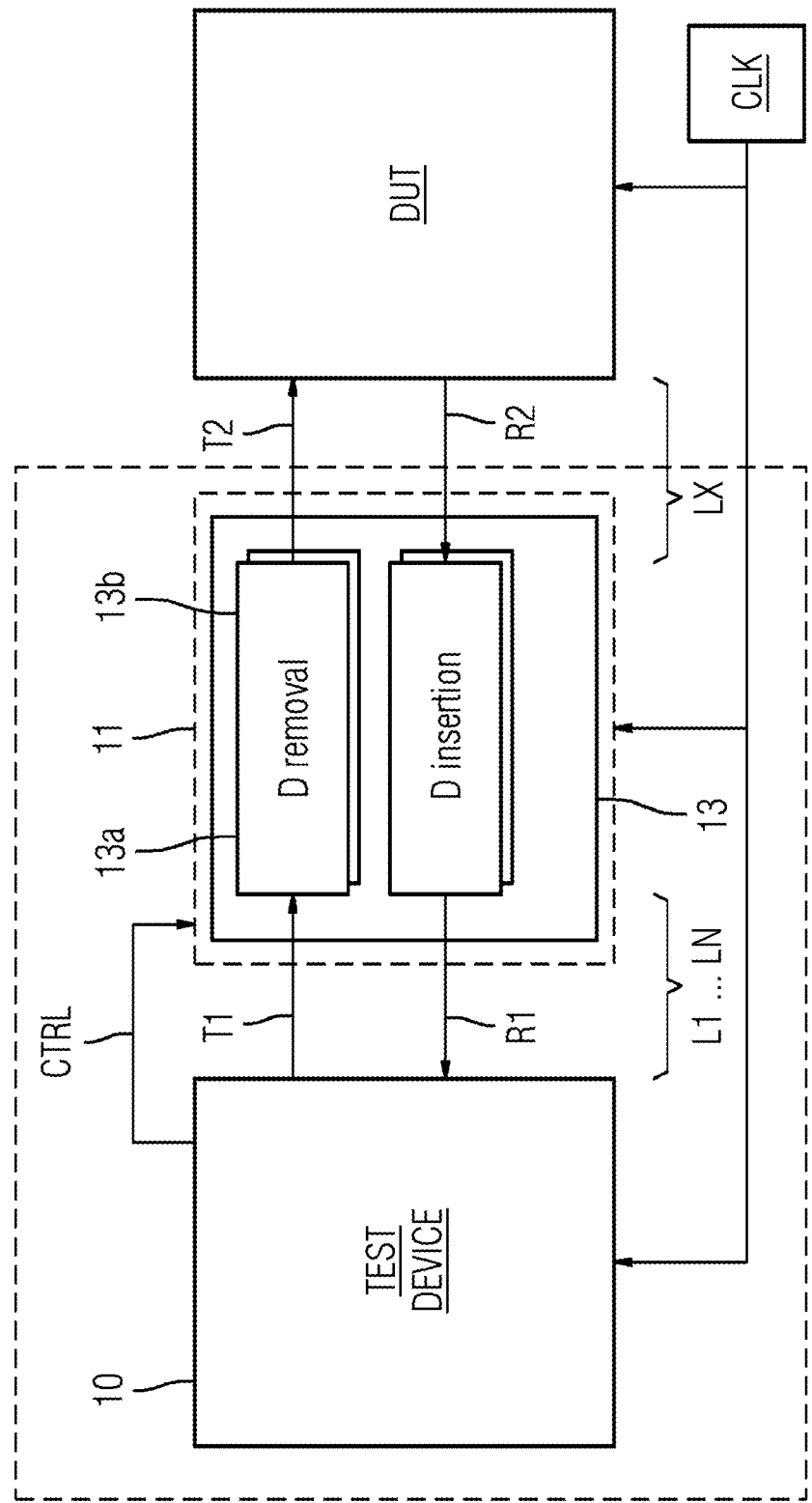
FIG. 9 depicts yet another example of an adapter communicatively coupled to a test device and a device under test.

Now turning to FIG. 9, combining multiple lanes via an embodiment of the adapter is possible. To this end, XAUI interface may be used. XAUI is a four-lane interface with a baud rate of 3.125 Gb/s-per-lane serial and an effective transmission rate of 10 Gbit/s. Each lane is a differential pair carrying current mode logic (CML) signaling, and the data on each lane is 8B/10B encoded before transmission.

Hence, the transmission rate may be increase, when data is transmitted from the test device via two or more lanes and is compiled into one high-speed line by the adapter. For example, 2 times 25 GbE lanes may be combined to form a 1-time 32 GbE link.

The adapter 11 enables support of line rates and voltage levels that are not supported by the test device 10 by default. The devices 10, 11, 12 may be clocked according to the same clock domain. A master CLK does deliver the clock signal (e.g., 10 MHz) to the devices 10, 11, 12. The interface of the test device 10 may be standard 25 GbE or another protocol and may be connected via multiple QSFP28 lanes. In case of multiple lanes there may be provided multiple parallel delay removal/insertion blocks, e.g., one delay and insertion block per lane.

The adapter may decrease or increase the original line or transmission rate. In case the line rate is increased data units are transmitted from the test device 10 to the adapter 11 via multiple, e.g., optical, lanes. For example, the test device 10 may possess two 25 Gbps interfaces. Data units and delay characters may be transmitted via the two interface and may be combined into a single data stream, by the adapter 11. The adapter 11 removes the delay characters an combines the data units received via the different lanes into a single data stream including the data units received. The transmission rate of the single data stream may then be matched to the transmission rate of the communication interface of the DUT. This may be achieved by inserting a corresponding amount of delay characters into the transmission of data unit from the test device to the adapter. For example, the amount of the delay characters inserted by the test device and transmitted to the adapter may correspond to the amount necessary, to match the transmission rate of the DUT of 32 Gbps, when the two transmission lanes are combined.

In case the transmission rate is to be decreased, e.g., to match a DUT operating at a bit rate of 50 Mbits, the transmission rate of the test device 10, of say 25 Gbps, is decreased by inserting sufficient delay characters to reduce the bit rate of 25 Gbps to 50 Mbits.

In the transmission direction from the DUT to the test device, the adapter 11 is operative and configured to insert delay characters to match the transmission rate of the test device 10.

The adapter may also include a control interface CTRL, which may be used for programming the adapter 11 and/or for status information retrieval. Thereby, the adapter 11 is programmable to remove or add additional delay characters from the data path between the test device 10 and the DUT 12. This may be necessary to mitigate the effects of jitter on the transmission line(s) between the test device 10 and the adapter 11 and the transmission line(s) between the adapter 11 and the DUT 12, respectively.

As shown by the dashed line in FIG. 9, the adapter 11 may be included in the test device 10, e.g., within its housing, or may otherwise be communicatively coupled with the test device 10.

The transmission rate is the volume of data transmitted over a transmission channel or via a data interface within a specified unit of time. The units used for this are baud or bits/s. Hence, the transmission rate may be the bit rate (bitrate or as a variable R), which is the number of bits that are conveyed or processed per unit of time. The bit rate may be quantified using the bits per second unit (symbol: "bit/s"), e.g., in conjunction with an SI prefix such as "kilo" (1 kbit/s=1,000 bit/s), "mega" (1 Mbit/s=1,000 kbit/s), "giga" (1 Gbit/s=1,000 Mbit/s) or "tera" (1 Tbit/s=1000 Gbit/s).

A line code is a pattern of voltage, current, or photons used to represent digital data transmitted down a transmission line. In digital communication systems, the physical layer gross bitrate, raw bitrate, data signaling rate, gross data transfer rate, or uncoded transmission rate (sometimes written as a variable Rb or fb) is the total number of physically transferred bits per second over a communication link, including useful data as well as protocol overhead. The gross bit rate is related to the symbol rate or modulation rate, which is expressed in bauds or symbols per second.

A transmission line is a specialized cable or other structure designed to conduct alternating current of radio frequency, that is, currents with a frequency high enough that their wave nature are taken into account. Transmission lines are used for purposes such as connecting radio transmitters and receivers with their antennas (they are then called feed lines or feeders), distributing cable television signals, trunk-lines routing calls between telephone switching centers, computer network connections, and high-speed computer data buses.

A data unit may correspond to at least part of any one or more of the following, in particular relating to the OSI-model: in Layer 1 (Physical Layer) a data unit corresponds to one bit, in Layer 2 (Data Link Layer) the data unit corresponds to one frame, in Layer 3 (Network Layer) the data unit corresponds to one packet, in Layer 4 (Transport Layer) the data unit corresponds to one segment, and in Layer 5 data unit corresponds to data. However, other transfer units, (e.g., a datagram), may be identified as a data unit.

Adaptation circuitry may in particular include digital (electronic) circuits that operate on digital signals. Digital electronic circuits may be made from large assemblies of logic gates, which may be printed on integrated circuits. The adaptation circuitry may be operated based on a clock signal, which causes a change of the systems state, when a "clock" signal changes state.

Now the adapter may include additional circuitry, e.g., for receiving the one or more data units and/or for transmitting the one or more data units. On the other hand, such circuitry may be included in the adaptation circuitry itself.

The adapter may be a separate device, e.g., including its own housing, but may alternatively be incorporated into another device, e.g., with the housing of another device.

Figure 10:
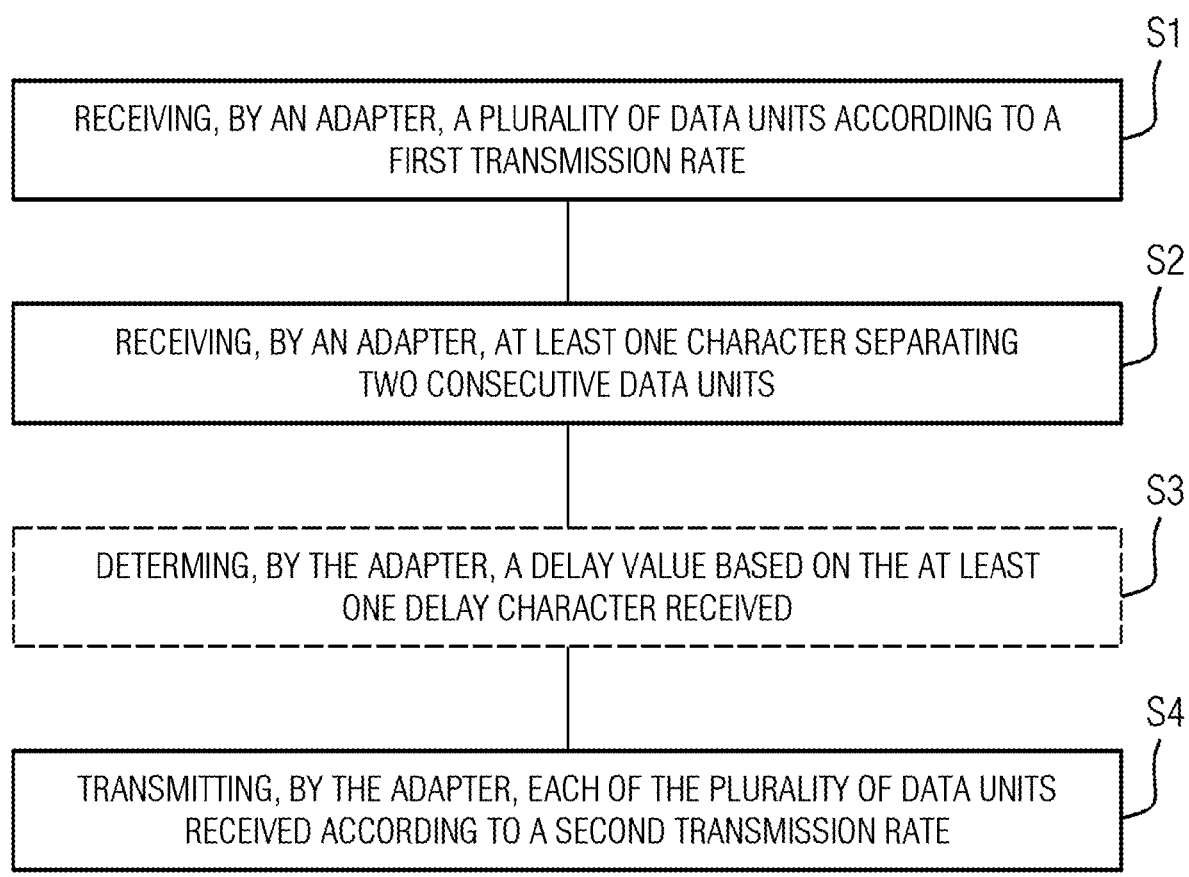
FIG. 10 depicts exemplary method acts according to a first embodiment.

Turning to FIG. 10, exemplary method acts of a first embodiment from the perspective of an adapter for trans-mission rate adaptation are shown. In a first act S1, a plurality of data units is received by an adapter according to a first transmission rate. The data units may, as described be, segments of data that has been split to suitable blocks. The data units may include stimulus data for testing a device under test (DUT). On the other hand, the data units may include, (e.g., in case they are received from the DUT), data that been created by the DUT in response to the stimulus data.

In an act S2, at least one delay character separating two consecutive data units is received by an adapter. More than one delay character may be received. The number of delay characters received may depend on the ratio between the first and second transmission rate, or vice versa. The one or more delay characters may be received.

Transmission of the data units and the one or more delay characters may be executed by the test device. Information included in the data units may relate to testing stimulus for testing a DUT. The testing stimulus may be stored in the test device or may as be created or processed by the test device according to a testing model and/or corresponding testing task.

In an act S3, a delay value based on the at least one delay character received is determined by the adapter. The delay value may directly relate to the number of delay characters received or may be scaled according to a scale function stored in the adapter.

In an act S4, each of the plurality of data units received according to a second transmission rate is transmitted by the adapter. Thus, effectively allowing the receiver, (e.g., a device under test), to receive all of the data units transmitted by the test device without loss off any data unit due to the mismatched transmission rates or due to buffer overflow.

Figure 11:
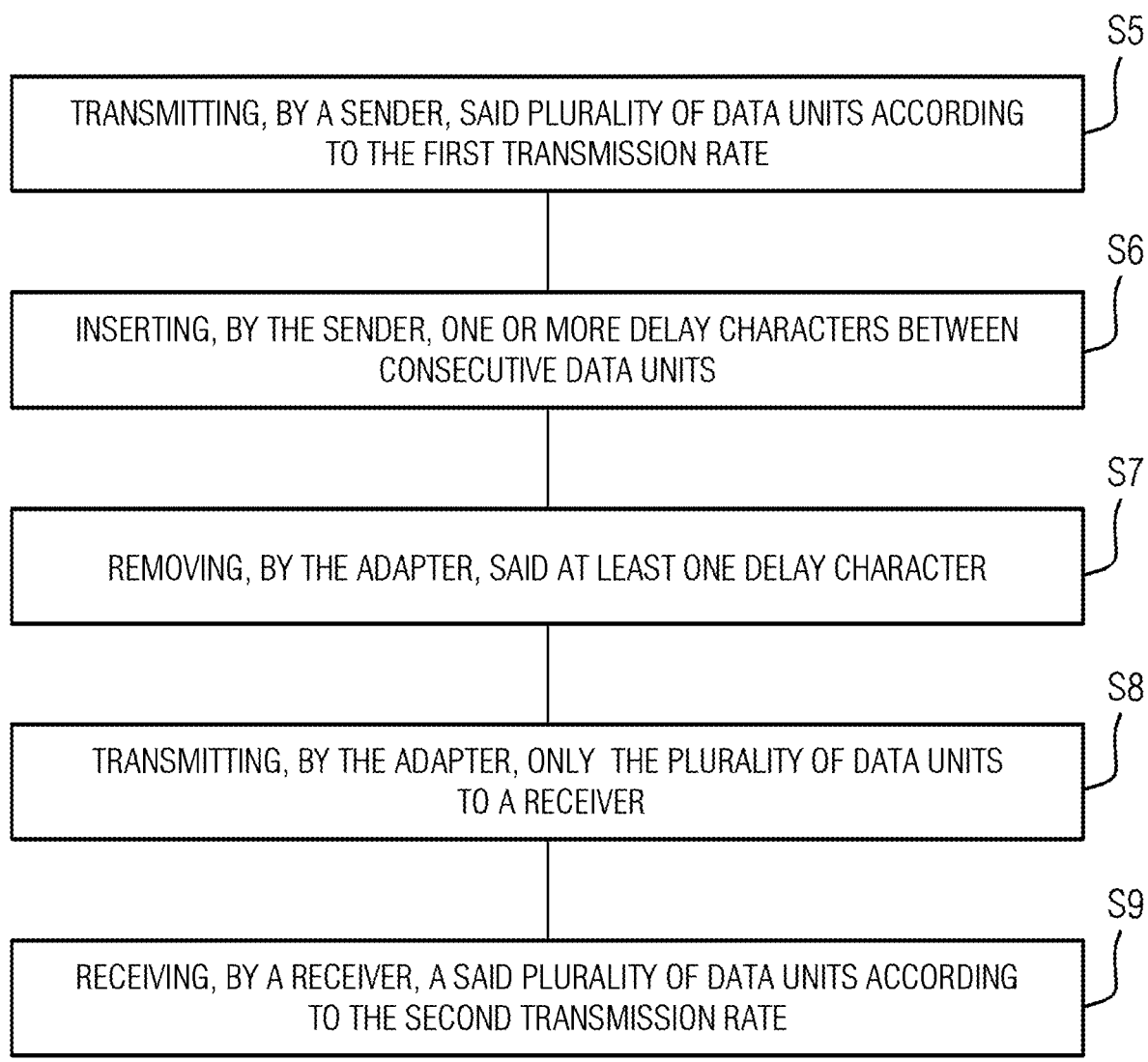
FIG. 11 depicts exemplary method acts according to a second embodiment.

Turning to FIG. 11, exemplary method acts of a second embodiment from the perspective of the sender, receiver, and adapter for data rate adaptation are shown. In an act S5, a plurality of data units according to the first transmission rate is transmitted by a sender. The sender may be the test device as described throughout the present specification in the above. As already mentioned, the data units may include stimulus data, also known as test patterns, which are used to validate or verify, as the case may be, whether the device under test is working correctly.

In an act S6, one or more delay characters between consecutive data units are inserted by the sender. At least two or more than two delay characters may be inserted between consecutive data units.

In an act S7, the at least one delay character is removed by the adapter. In case of a plurality of delay characters, all of the delay characters are removed from the sequence of characters received by the adapter. The adapter may receive a consecutive stream of characters. Those characters received may represent data characters or delay characters. For the purpose of transmitting the data characters to the receiver, the adapter removes the delay characters from the data stream. Thus, in an act S8, only the plurality of data units is transmitted from the adapter to a receiver. As transmission of data units from the adapter to the receiver takes place according to a second transmission rate, the plurality of data units is received in an act S9 by the receiver according to the second transmission rate. The receiver may be a device under test as described in the above. In the pre-silicon phase, the device under test may rather be a design under test (wherein the design under test describes the planned device). The device under test may thus only be simulated or emulated, e.g., using an FPGA.

Figure 12:
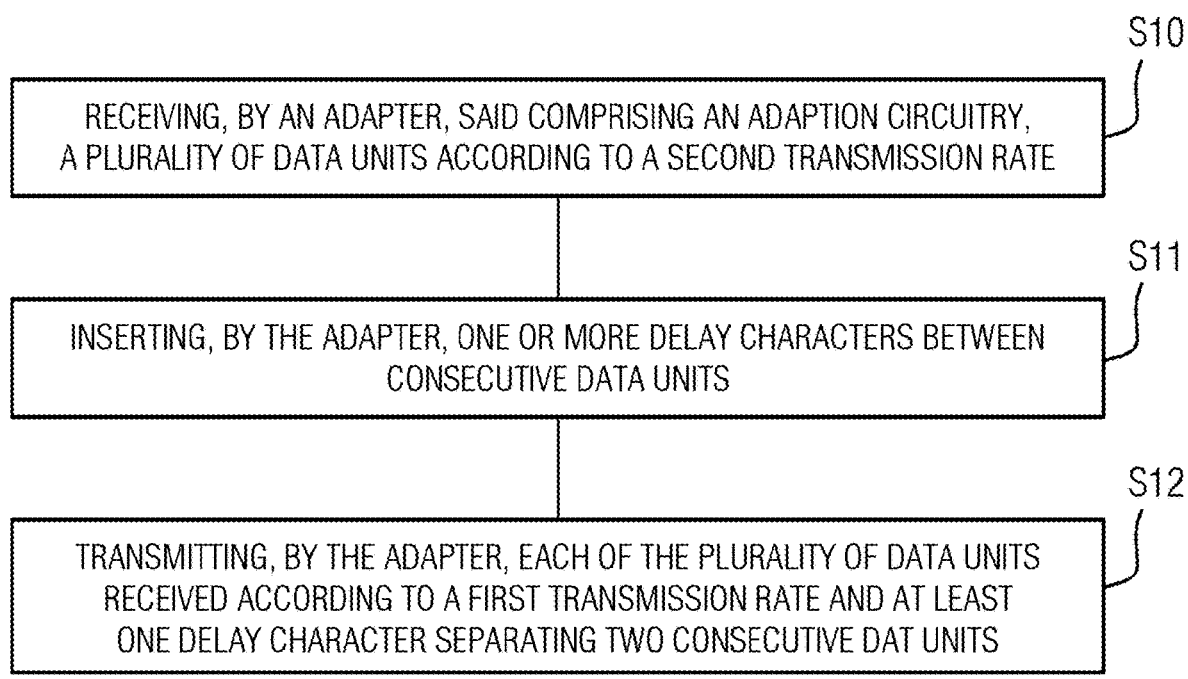
FIG. 12 depicts exemplary method acts according to a third embodiment.

Turning to FIG. 12, exemplary method acts of a third embodiment from the perspective of an adapter for data rate adaptation are shown. In this embodiment, the data units may be received from the device under test, e.g., via a link between the adapter and the device under test. Thus, in this embodiment the data units are received from the device that has formerly acted a receiver but is now a transmitter.

In an act S10, a plurality of data units according to a second transmission rate is received by an adapter. The adapter may include an adaptation circuitry, e.g., in the form of an FPGA. The data unit received may not be segmented into data units but rather may be part of a data transmission that includes these data units.

In an act S11, one or more delay characters between consecutive data units are inserted by the adapter. Now, for transmission from the adapter and in order to adapt the different transmission rates between the links to sender and receiver of the data units, which by way of example may be the device under test and the test device, delay characters may be inserted by the adapter. At least two or more than two delay characters may be inserted by the adapter. To this end, the adapter may be specifically programmed.

In an act S12, each data unit of the plurality of data units received and at least one delay character separating two consecutive data units is transmitted, by the adapter, according to a first transmission rate. Hence, for the faster trans-mission speed on the link between the adapter and the receiver, e.g., test device, the delay characters are inserted and transmitted by the adapter. The receiver of the delay characters may then remove or discard the delay characters, e.g., after having identified or detected, in particular after having decoded, a delay character. To this end, the receiver, (e.g., the test device), may also be specifically programmed to identify and subsequently discard the delay characters from further processing.

In the above embodiments relating to FIGS. 10 to 12, the case wherein the transmission rate has been slowed down via the second link, which second link connects the adapter with, e.g., the device under test, has been discussed.

Now, turning to FIG. 12, exemplary method acts of a fourth embodiment are shown. Therein, the second link connects the adapter with, e.g., the device under test, may have a higher transmission rate than an individual link or lane connecting the adapter with, e.g., the test device. Hence, in the following the transmission rate of the link to the device under test is increased.

In an act S13, a first plurality of data units according to a first transmission rate and at least one delay character separating two consecutive data units of the first plurality of data units are received via a first transmission line by an adapter.

In an act S14, a second plurality of data units and at least one delay character separating two consecutive data units of the second plurality of data units are received by the adapter according to the first transmission rate via a second transmission line.

Then, in an act S15, the first and the second plurality of data units received according to a second transmission rate are transmitted by the adapter via a third transmission line, wherein the second transmission rate is determined based on the at least one delay character received. Thus, the first and second transmission line connect the adapter with the sender, e.g., the test device. However, more than two transmission lines between the adapter and the sender, e.g., the test device, may exist. The third transmission line may connect the adapter with receiver, e.g., the device under test.

Figure 13:
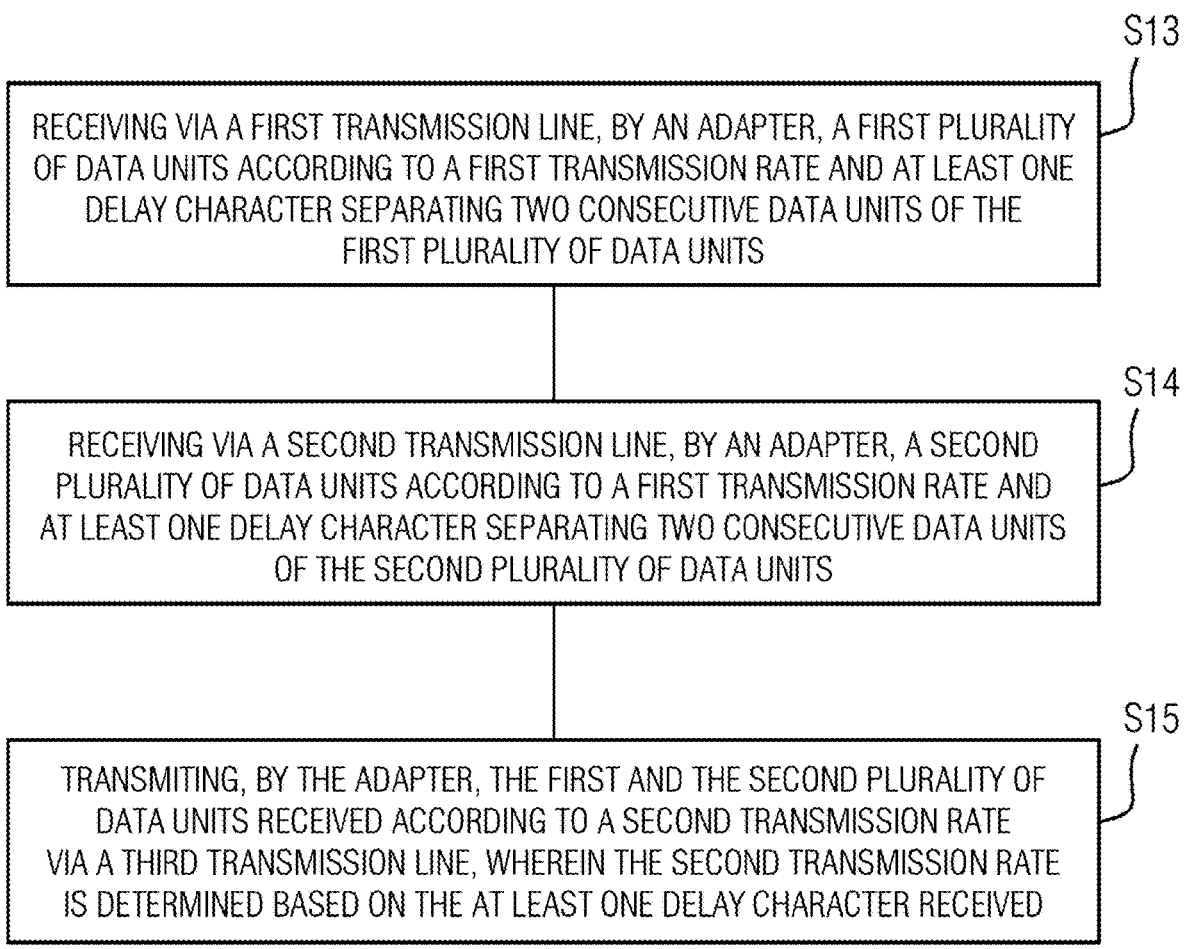
FIG. 13 depicts exemplary method acts according to a fourth embodiment.

Now, the reverse direction of transmission will be discussed according to the embodiment according to FIG. 14. The embodiments of FIGS. 13 and 14 may be combined to a single embodiment, e.g., an adapter being able to bidirectionally communicate with the receiving and transmitting sides. The same is true for the embodiments as described relating to FIGS. 10 to 12.

Thus, in an act S16, a first and a second plurality of data units according are received by the adapter according to the second transmission rate via the third transmission line.

In an act S17, the first plurality of data units is transmitted by the adapter via the first transmission line according to a first transmission rate and at least one delay character separating two consecutive data units of the first plurality of data units. As the case may be, it may be necessary to insert delay characters on the multiple transmission lines connecting the adapter with the receiving end in order to match the first and second transmission rate.

Hence, in an act S18, the second plurality of data units according to the first transmission rate and at least one delay character separating two consecutive data units of the second plurality of data units are transmitted via the second transmission line by the adapter. Hence, the receiving side may identify and remove or discard the delay characters from further processing and may only process the data units including, e.g., the payload data to the evaluated.

As has been shown methods and devices for data rate adaptation between senders and receivers have been proposed. Those skilled in the art will recognize improvements and modifications to the embodiments of the present disclosure. All such improvements and modifications are considered within the scope of the concepts disclosed herein.

It is to be understood that the elements and features recited in the appended claims may be combined in different ways to produce new claims that likewise fall within the scope of the present disclosure. Thus, whereas the dependent claims appended below depend on only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for transmission rate adaptation of one or more data units performed a test system comprising an adapter being located between a test device and a device under test, the method comprising:
   receiving, by the adapter comprising an adaptation circuitry, a plurality of data units according to a first transmission rate and at least one delay character separating two consecutive data units;
   removing, by the adapter, the at least one delay character; and
   transmitting, by the adapter, only the received plurality of data units to the device under test according to a second transmission rate, wherein the second transmission rate is determined based on the at least one delay character received.

2. The method of claim 1, further comprising:
   determining, by the adapter, a delay value based on the at least one delay character received.

3. The method of claim 1, further comprising:
   transmitting, by a sender, the plurality of data units according to the first transmission rate; and
   inserting, by the sender, one or more delay characters between consecutive data units of the plurality of data units.

4. The method of claim 1, further comprising:
   receiving, by the device under test, the plurality of data units according to the second transmission rate.

5. The method of claim 1, wherein a data unit of the plurality of data units is a data frame or a data packet.

6. The method of claim 1, further comprising:
   determining, by the adapter, the second transmission rate based on a number of delay characters received between the two consecutive data units received according to the first transmission rate.

7. The method of claim 2, further comprising:
   transmitting, by a sender, the plurality of data units according to the first transmission rate; and
   inserting, by the sender, one or more delay characters between consecutive data units of the plurality of data units.

8. A method for transmission rate adaptation of one or more data units performed a test system comprising an adapter being located between a test device and a device under test, the method comprising:
   receiving, by the adapter comprising an adaptation circuitry, a plurality of data units according to a first transmission rate and at least one delay character separating two consecutive data units;
   determining, by the adapter, a second transmission rate based on a number of delay characters received between the two consecutive data units received according to the first transmission rate; and transmitting, by the adapter, each data unit of the plurality of data units received according to the second transmission rate, wherein the second transmission rate is determined based on the at least one delay character received.

9. The method of claim 8, further comprising:
receiving, by the device under test, the plurality of data units according to the second transmission rate.

10. The method of claim 8, further comprising:
inserting and/or removing, by the adapter, one or more delay characters between the two consecutive data units based on a timing jitter of a clock signal of a first transmission line for transmitting data units of the plurality of data units according to the first transmission rate and/or a second transmission line for transmitting data units of the plurality of data units according to the second transmission rate.

11. The method of claim 8, further comprising:
determining, by the adapter, a delay value based on the at least one delay character received.

12. The method of claim 8, wherein a data unit of the plurality of data units is a data frame or a data packet.

13. A method for transmission rate adaptation of one or more data units performed by a test system comprising an adapter being located between a test device and a device under test, the method comprising:
receiving, by the adapter comprising an adaptation circuitry, a plurality of data units according to a second transmission rate;
inserting, by the adapter, one or more delay characters between two consecutive data units based on a timing jitter of a clock signal of a first transmission line for transmitting data units of the plurality of data units according to a first transmission rate and/or a second transmission line for transmitting data units of the plurality of data units according to the second transmission rate; and
transmitting, by the adapter, each data unit of the plurality of data units received according to the first transmission rate and the one or more delay characters separating the two consecutive data units to the test device.

14. A method for transmission rate adaptation of one or more data units performed a test system comprising an adapter being located between a test device and a device under test, the method comprising:

receiving, by the adapter comprising an adaptation circuitry, a plurality of data units according to a first transmission rate and at least one delay character separating two consecutive data units,
inserting and/or removing, by the adapter, one or more delay characters between the two consecutive data units based on a timing jitter of a clock signal of a first transmission line for transmitting data units of the plurality of data units according to the first transmission rate and/or a second transmission line for transmitting data units of the plurality of data units according to a second transmission rate, and
transmitting, by the adapter, each data unit of the plurality of data units received according to the second transmission rate, wherein the second transmission rate is determined based on the one or more delay characters.

15. The method of claim 14, further comprising:
determining, by the adapter, the second transmission rate based on a number of delay characters received between the two consecutive data units received according to the first transmission rate.

16. The method of claim 14, further comprising:
receiving, by the device under test, the plurality of data units according to the second transmission rate.

17. The method of claim 14, further comprising:
determining, by the adapter, a delay value based on the at least one delay character received.

18. The method of claim 14, wherein a data unit of the plurality of data units is a data frame or a data packet.

19. An adapter of a test system for adapting a transmission rate of one or more data units, the adapter being located between a test device and a device under test, the adapter comprising:
an adaptation circuitry,
wherein the adapter is configured to:
receive a plurality of data units according to a first transmission rate and at least one delay character separating two consecutive data units;
remove the at least one delay character; and
transmit only the received plurality of data units to the device under test according to a second transmission rate, wherein the second transmission rate is determined based on the at least one delay character received.

* * * * *